United States Patent
Bandic et al.

(10) Patent No.: US 9,836,350 B2
(45) Date of Patent: Dec. 5, 2017

(54) JOINT DECODING OF REWRITING NVM ERROR SECTORS

(71) Applicant: Western Digital Technologies, Inc., San Jose, CA (US)

(72) Inventors: Zvonimir Z. Bandic, San Jose, CA (US); Kiran Kumar Gunnam, Milpitas, CA (US); Robert Eugeniu Mateescu, San Jose, CA (US); Minghai Qin, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 127 days.

(21) Appl. No.: 14/871,096

(22) Filed: Sep. 30, 2015

(65) Prior Publication Data
US 2017/0091024 A1 Mar. 30, 2017

(51) Int. Cl.
| H03M 13/00 | (2006.01) |
| G06F 11/10 | (2006.01) |
| G11C 13/00 | (2006.01) |
| G11C 29/52 | (2006.01) |

(52) U.S. Cl.
CPC ...... G06F 11/1068 (2013.01); G11C 13/0064 (2013.01); G11C 13/0069 (2013.01); G11C 29/52 (2013.01); H03M 13/616 (2013.01)

(58) Field of Classification Search
CPC ............. G06F 11/1068; G11C 13/0069; G11C 29/52; G11C 13/0064; H03M 13/616
See application file for complete search history.

(56) References Cited

U.S. PATENT DOCUMENTS

| 6,735,121 | B2 | 5/2004 | Yoshida | |
| 7,665,007 | B2 | 2/2010 | Yang et al. | |
| 8,612,798 | B1 | 12/2013 | Tsai | |
| 2005/0281113 | A1 | 12/2005 | Yada et al. | |
| 2011/0029839 | A1* | 2/2011 | Zhong | H03M 13/098 714/763 |
| 2011/0170212 | A1 | 7/2011 | Choi et al. | |
| 2013/0024748 | A1* | 1/2013 | Sharon | G06F 11/1072 714/773 |
| 2013/0031430 | A1 | 1/2013 | Sharon | |
| 2013/0166988 | A1* | 6/2013 | Sharon | G06F 11/1012 714/758 |

(Continued)

*Primary Examiner* — Guy Lamarre
(74) *Attorney, Agent, or Firm* — Patterson & Sheridan, LLP

(57) ABSTRACT

Embodiments disclosed herein generally relate to an error correction method for non-volatile memory. The error correction method writes data to a first location from a block of user data stored in DRAM. The data written to the first location is verified and errors are identified. Upon determining the number of identified errors exceed a threshold, the block of user data is re-writing to a second location. The data written to the second location is verified and errors are identified. The data written to the first location and the data written to the second location are compared and all discrepancy bits are erased in the comparison. A joint parity check matrix is built with the data written to the first location and the data written to the second location. A code word matrix is built with the comparison. A resultant of the joint parity check matrix and the code word matrix is determined if it is invertible.

14 Claims, 3 Drawing Sheets

(56) References Cited

U.S. PATENT DOCUMENTS

2014/0136889 A1* 5/2014 Kuang ............... G06F 11/1076
　　　　　　　　　　　　　　　　　　　　　　714/15
2014/0304456 A1 10/2014 Narasimha et al.

* cited by examiner

JOINT DECODING OF REWRITING NVM ERROR SECTORS

BACKGROUND

Field

Embodiments disclosed herein generally relate to an improved method for joint decoding user data from more than one memory location.

Description of the Related Art

The performance of non-volatile memory (NVM) is limited by the raw bit error rate of NVM cells. The write noise may introduce errors, such that the actual bit-value stored in the NVM is not what was intended. For example, an intended bit-value of 0 might be inadvertently flipped to an incorrect bit-value of 1. Correction of write errors is important to assure data integrity and to increase the lifetime of NVM cells.

Various conventional error correction schemes are available to address such errors. One common error correction scheme relies on cyclic error-correcting codes that are constructed using finite fields such as the BCH. BCH code which is an acronym comprising the initials of the inventors' names (Raj Bose, Alexis Hocquenghem, and D. K. Ray-Chaudhuri), or other similar codes, which are random error correcting codes in which each bit is assumed to have an independent error probability rate. However, use of these conventional error correction schemes to achieve high reliability in NVM devices tends to result in a reduced data rate because they are designed to deal with a high number of errors.

The performance of NVMs is limited by raw bit error rate of NVM cells. Phase change memory (PCM) is a type of NVM which can read very quickly but writes are slower by several orders of magnitude. The write noise induces errors such that the actual bit-value stored in the NVM cells may not be the same as it was intended. For example, the sector may have an intended value of '0' which may have been unexpectedly flipped during the write to a value of '1'. Correcting write errors is essential for increasing the lifetime and in assuring the data integrity of NVMs. Conventionally, error correction codes (ECCs) are widely used to detect/correct these and other write errors in NVM. Conventional error correction codes may also have a higher read latency because of the decoding complexity involved. Further, conventional error correction codes may also result in a higher probability of data loss.

Therefore, there is a need in the art for an improved method and system for error correction in non-volatile memory cells.

SUMMARY

Embodiments disclosed herein generally relate to an improved system and method for joint decoding user data from more than one memory location. More particularly, embodiments disclosed herein generally relate to an error correction method for non-volatile memory. The error correction method writes data to a first location from a block of user data stored in DRAM. The data written to the first location is verified and errors are identified. Upon determining the number of identified errors exceeds a threshold, the block of user data is re-writing to a second location. The data written to the second location is verified and errors are identified. The data written to the first location and the data written to the second location are compared and all discrepancy bits are erased in the comparison. A joint parity check matrix is built with the data written to the first location and the data written to the second location. A code word matrix is built with the comparison. A resultant of the joint parity check matrix and the code word matrix is determined if it is invertible.

In another embodiment, a computer-readable storage medium stores a program, which, when executed by a processor performs an operation for correcting errors in non-volatile memory. The operation performs a method for error correction in non-volatile memory. The error correction method writes data to a first location from a block of user data stored in DRAM. The data written to the first location is verified and errors are identified. Upon determining the number of identified errors exceed a threshold, the block of user data is re-writing to a second location. The data written to the second location is verified and errors are identified. The data written to the first location and the data written to the second location are compared and all discrepancy bits are erased in the comparison. A joint parity check matrix is built with the data written to the first location and the data written to the second location. A code word matrix is built with the comparison. A resultant of the joint parity check matrix and the code word matrix is determined if it is invertible.

In yet another embodiment, a system, has a processor; and a memory. The memory includes an application program configured to perform an operation for correcting errors in non-volatile memory. The error correction method writes data to a first location from a block of user data stored in DRAM. The data written to the first location is verified and errors are identified. Upon determining the number of identified errors exceeds a threshold, the block of user data is re-writing to a second location. The data written to the second location is verified and errors are identified. The data written to the first location and the data written to the second location are compared and all discrepancy bits are erased in the comparison. A joint parity check matrix is built with the data written to the first location and the data written to the second location. A code word matrix is built with the comparison. A resultant of the joint parity check matrix and the code word matrix is determined if it is invertible.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments in any field involving magnetic sensors.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
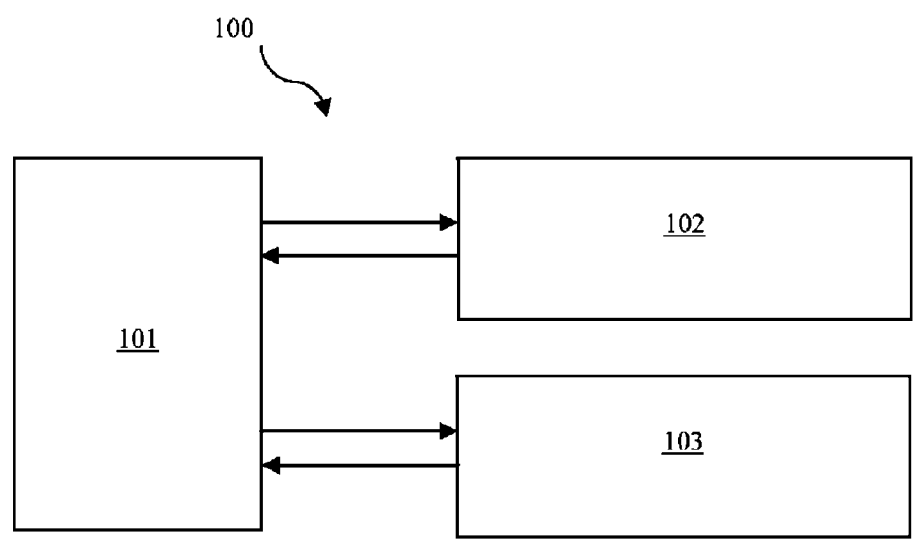
FIG. 1 illustrates an example of a data storage system.

Additional features and advantages will be set forth in the detailed description which follows, and in part will be readily apparent to those skilled in the art from that description or recognized by practicing the embodiments as described herein, including the detailed description which follows, the claims, as well as the appended drawings.

In the following, reference is made to embodiments. However, it should be understood that the disclosure is not limited to specific described embodiments. It is to be understood that both the foregoing general description and the following detailed description are merely exemplary, and any combination of the following features and elements, whether related to different embodiments or not, is contemplated to implement and practice the claimed subject matter. Furthermore, although embodiments described herein may achieve advantages over other possible solutions and/or over the prior art, whether or not a particular advantage is achieved by a given embodiment is not limiting of the claimed subject matter. Thus, the following aspects, features, embodiments and advantages are merely illustrative and are not considered elements or limitations of the appended claims except where explicitly recited in a claim(s).

As will be appreciated by one of ordinary skill in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized for storing a program product which, when executed, is configured to perform method for scheduling a preventative maintenance event. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present disclosure may be written in any combination of one or more programming languages. The computer program instructions may be loaded onto a programmable data processing apparatus to cause a series of operational steps to be performed on the apparatus or other devices to produce a computer implemented process such that the instructions which execute on the programmable apparatus which provide processes for implementing the functions/acts specified in the flowchart and/or block diagram block or blocks.

FIG. 1 depicts one architecture of a system suitable for storing and executing the methods in which embodiments of the present disclosure may be implemented. This figure in no way limits or is intended to limit the scope of the present disclosure. FIG. 1 illustrates an example of a data storage system 100, according to an embodiment of the present disclosure. The data storage system 100 may be non-volatile. That is, the data storage system 100 may be long term and persistent. The data storage system 100 may have solid state memory, such as a solid state drive, or contain magnetic media, such as a traditional hard disk drive. Some classes of the solid state drives include magnetoresistive RAM (MRAM), phase change memory (PCM), or ferroelectric RAM (F-RAM) to name a few. The data storage system 100 includes a control circuit 101, a memory circuit 102, and a memory circuit 103. Control circuit 101 may be, for example, a memory controller circuit, a processor circuit, or any other type of control circuit. Control circuit 101 generates parity bits for adding to the data which is utilized for protecting and decoding write errors. The parity bits are stored in one or both of memory circuits 102-103 in a block of written data. The block contains both the parity bits and data bits and access to the NVM utilizes the blocks for writing the bits to the memory circuits 102-103 wherein each bit is written to a sector, or cell, of the NVM memory. Control circuit 101 may provide bits to and receive bits from memory circuits 102-103. Bits are transmitted between control circuit 101 and memory circuits 102-103 through one or more on-chip or external buses or through other types of signal lines. Control circuit 101, memory circuit 102, and memory circuit 103 may be in the same integrated circuit or in separate integrated circuits. Thus, system 100 may be a single integrated circuit device that includes circuits 101-103. Alternatively, system 100 may include three, or more, separate integrated circuit devices 101-103.

Figure 2:
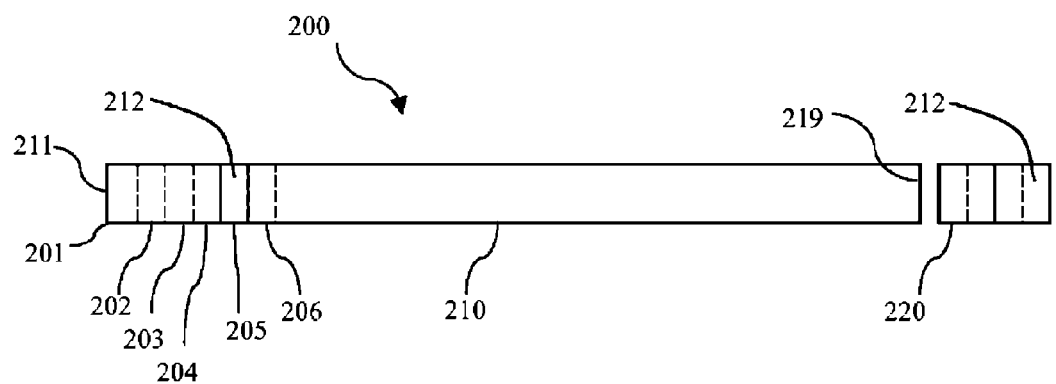
FIG. 2 illustrates conventional storage architecture for memory circuits of the data storage system.

FIG. 2 illustrates a storage architecture for the memory circuits 102-103 of the data storage system 100. The storage architecture illustrates a block 200 of NVM corresponding to a unit for a single write of memory. The block 200 may have writable bits 212 or sectors. The bits 212 may be written with a value of '0' or a value of '1'. Alternately, the value of the bits 212 may be erased, i.e., neither a '0' nor a '1'. A plurality of bits 212 may form a data sector 210 in the block 200. The data sector 210 may have 8k or more bits 212. The bits 212 in the data sector 210 may be incrementally numbered from a beginning 211 to an end 219 of the data sector. For example, the bit 212 in a first sector 201 would have an index number of '1', the bit 212 in a second sector 202 would have an index number of '2', the bit 212 in a third sector 203 would have an index number of '3', and so on for a fourth, fifth and sixth sectors 204, 205, 206 until the end 219 of the data sector 210 is reached. In one embodiment, a write operation assigns a '0' or a '1' to each bit 212 in the data sector 210. Writes smaller than the length of the data sector 210, i.e., having less bits than the total amount of bits 212 in the data sector 210, may optionally pad the write with '0' to fill all the bits in the data sector 210 to the end 219 of the data sector 210. The block 200 may also optionally have an error code checking (ECE) sector 220. The ECE sector 220 has a plurality of bits 212 which are configured to store values of '0' and '1'. The number of bits 212 in the ECE sector 220 may be dependent on the error checking schema used. For example, in a BCH error checking schema suitable for correcting 1 error, the number of bits 212 in the ECE sector 220 includes 4 parity check bits for a block 200 having 15 bits. In one embodiment, the ECE sector 220 may have zero bits 212 and parity bits may be stored in the data sector 210 for error checking.

The longer the block 200 length, the greater the number of bits 212 and the greater the raw block error rate. A block error happens if any bit in a block is in error. In one embodiment, the system 100 utilizes memory circuit 102 containing phase-change memory (also known as PCM, PCME, PRAM, PCRAM, Ovonic Unified Memory, Chalcogenide RAM and C-RAM). In PCM memory, reads can be performed very quickly but writes are slower. For example, the reading of a chunk of memory may take as little as $\frac{1}{50}^{th}$ the time for writing the same chunk of memory. Additionally, the raw bit error rate (RBER) for PCM memory is very low, such as on the order of $10e^{-5}$ or $10e^{-6}$. Therefore, all the space allocated in memory for error detection, such as BCH parity 220 or other conventional schemas for error correction/detection, is not required. The low raw bit error rate and the short block length used in PCM memory means that most blocks are essentially error-free, i.e., have a low raw block error rate. Thus, the complicated error correction schemas, such BCH codes, are not necessary due to the low RBER.

Reading a sector takes much less time than writing a sector, so we can take advantage of the fast reading by reading a sector after writing a sector to discover any bits written in error without encroaching in on the write latency. We can use CRC check to determine if any uncorrectable errors exist in the written sector. If there is one error or less in the sector, the data can be recovered fast and accurately by implementing a Hamming code. Otherwise, in the scenarios where there is more than one error in the written block, the same information from the first write is re-written a second time but to a redundancy sector, i.e., a separate and different location than the first write. Where both the first and second writes includes uncorrectable errors, the errors may be corrected using joint decoding. Information from both the first and second writes is used to jointly decode the message. The joint decoding has much higher probability of success for decoding the errors than the independent decoding for each write. In one embodiment, data message is written to NVM, such as PCM and read for errors. After determining there is a write error, the original message is rewritten to a different location in the memory preserving the first write of the message in addition to the re-written message. When decoding, both the original message and rewritten message are used to joint decode an error free message.

Figure 3:
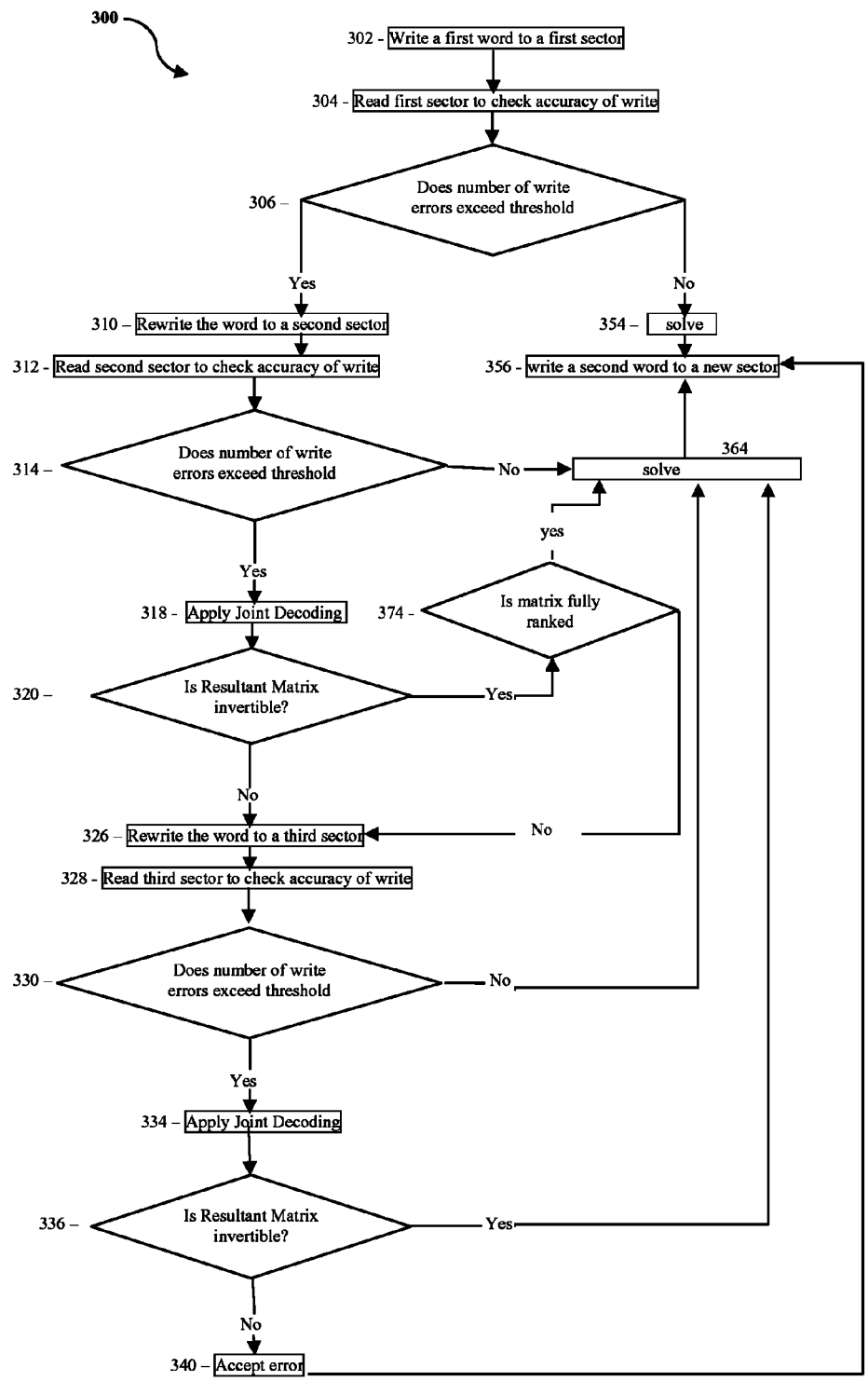
FIG. 3 is a flow chart for a method for joint decoding sector write errors in NVM.

FIG. 3 is a flow chart for a method 300 for joint decoding sector write errors in NVM. At block 302, a block of data is written to a first data sector in the NVM. The data is accompanied by parity bits embedded therein for determining if an error exists and optionally correcting the error. In one embodiment, the parity bits are assigned to the sectors having an index number which are powers of two. For example, the index numbers corresponding to $1(=2^0)$, $2(=2^1)$, $4(=2^2)$, $8(=2^3)$, etc. . . . may all contain parity bits. Thus, the first sector 201 and second sector 202 would contain parity bits while the third sector 203 would contain a data bit.

At block 304, the write is read to check the accuracy of the write. The write verify process writes the data to nonvolatile memory (NVM), such as PCM memory, from the Dynamic random-access memory (DRAM), and reads it back. At block 306, the read back bits from the NVM are compared to the original bits stored in the DRAM to check for write errors. The data written to the NVM may be correct or may contain some errors. A determination is made to check if the number of errors exceeds a threshold value. In one embodiment, the threshold value for the number of acceptable errors in the write may be one or less errors. If the number of errors is one and thus, does not exceed the threshold value, at block 354, the error is solved using an error correction code, such as a Hamming code, to determine the bad sector and the value of the sector. The value of the bad sector is fixed and write is accepted. If there are no errors, at block 354, the write is accepted. At block 356, a second block of data is written to new sectors in the NVM.

However, the Hamming code is limited in that it may only be able to correct one error. If the numbers of errors exceeds the threshold, i.e., is greater than 1, the word in the DRAM is rewritten to a second data sector at block 310. The second data sector is located on the NVM in a different address then the first data sector. Thus allowing the first data sector and the second data sector to coexist on the NVM for future reading and comparison of both the first and second data sector. At block 312, the second data sector is read to check the accuracy of the write. The write verify process reads back the data from the second data sector of the NVM. At block 314, the read back bits from the NVM are compared to the original bits stored in the DRAM to check for write errors. The rewritten data may be correct or may contain some errors. A determination is made to check if the number of errors exceeds the threshold value. If the number of errors is one and thus, does not exceed the threshold value, at block 364, the error is solved using error correction code to determine the bad sector and the value of the sector. The value of the bit is fixed and the write to the second data sector is accepted. If on read back it is determined that there are no errors in the write to the second data sector, at block 354, the write in the second data sector is accepted. At block 356, a second block of data is written to new sectors in the NVM for continued writing to the NVM.

However, for more than one error, determining the location and value of the bit in error becomes more challenging. If the numbers of errors in the write to the second data sector exceeds the threshold, i.e., is greater than 1, at block 318, joint decoding is used to correct the error in the data using the information written to the first and second data sector. If we have a very low BER, such as that found in PCM, we can assume errors will not be present in the same bit location for both the original written blocks and the rewritten blocks. Furthermore, we may assume the parity bits are not in error. Thus, potential errors in the written bits may be deduced from the comparison of the original written blocks and the rewritten blocks wherein the differences between the two writes indicate the bits having errors. When you read the data sector, you know that you have one or more errors but you don't know the location or value of the error. By comparing the two writes we can find mismatches in the first and second write. These mismatches may be errors in either the bit in the first write or the second write and thus you know a location of the error but not the value. Additionally, you are adding the error from the second write in the comparison. For example, if you have at least two errors in the first write, such as the first sector 201 and the fourth sector 204, and additional errors in the second write, such as the second sector 202 and fourth sector 204, the comparison of the first and second write will show as many discrepancies for the total number of errors in both the first and second write. Thus, the comparison will show errors in the first sector 201, the second sector 202, the third sector 203, and the fourth sector 204 for a total of four errors. You know the four locations but you don't know if the physical location of the error is in the first write or the second write. Therefore, you do not know the value of the bit in error. That is, the error in the first sector 201 may be from the first write or the second write. All we know is we had trouble recovering the bit in the four positions and that there is some mismatch at these locations in the two data blocks. Thus, we now know the locations and need to figure out the values. We erase the discrepancy bit in each of the four locations in the comparison so it is neither a 0 (zero) or a 1 (one). Erasing the discrepancy bits facilitates solving for the values.

We now build parity check matrices [H] for the two writes. A 3×7 parity check matrix $[H_g]$ may be constructed such that row one contains the '1's in the position of the first parity bit and all of the data bits that are included in its parity calculation. Row 2 contains '1's in the position of the second parity bit and all of the data bits that are included in its parity calculation. Lastly, row 3 contains the '1's in the position of the third parity bit and all of the data bits that are included in its parity calculation. A $[H_1]$ matrix can be constructed which corresponds to the first write. Additionally, a $[H_2]$ matrix can be constructed which corresponds to the second write. For example, the parity check matrices for the first and second writes may appear as follows:

$$H_1 = \begin{pmatrix} 1 & 1 & 0 & 1 & 1 & 0 & 0 \\ 1 & 0 & 1 & 1 & 0 & 1 & 0 \\ 0 & 1 & 1 & 1 & 0 & 0 & 1 \end{pmatrix} \text{ and } H_2 = \begin{pmatrix} 0 & 1 & 1 & 1 & 1 & 0 & 0 \\ 1 & 1 & 1 & 0 & 0 & 1 & 0 \\ 1 & 0 & 1 & 1 & 0 & 0 & 1 \end{pmatrix}$$

You can check the parity check matrix by multiplying the [H] matrix with a code word binary matrix [C]. The code word matrix [C] has all the data vales in the respective bit locations with variables in the location where the bits were erased. For example, if the data portion of a message is 4 bits long and we know the first bit is a '1' and the third bit is a '0', the code word matrix [C] will have the following elements {'1', $C_2$, '0', $C_4$} where $C_2$, and $C_4$ are the erased bits, i.e., unknown values. The product of [H]×[C] equals zero when there are no errors. Assuming there is no error in the parity code, the $[H_1]$ and $[H_2]$ matrices can individually only correct 1 error a piece. Therefore, if we have 2 or more errors in the first write we cannot decode the error unless we use joint decoding.

We can join the parity bits from $[H_1]$ and $[H_2]$ together to form a joint matrix by placing the $[H_1]$ matrix atop the $[H_2]$ matrix. Thus, we can obtain the joint decoding matrix $[H_j]$ by combining $[H_1]$ and $[H_2]$ together and taking the first 4 columns representing the parity bits (the last 3 columns forming the identity matrix [I]):

$$[H_j] = \begin{pmatrix} H_1 \\ H_2 \end{pmatrix} = \begin{pmatrix} 1 & 1 & 0 & 1 \\ 1 & 0 & 1 & 1 \\ 0 & 1 & 1 & 1 \\ 0 & 1 & 1 & 1 \\ 1 & 1 & 1 & 0 \\ 1 & 0 & 1 & 1 \end{pmatrix} \begin{pmatrix} 1 & 0 & 0 \\ 0 & 1 & 0 \\ 0 & 0 & 1 \\ 1 & 0 & 0 \\ 0 & 1 & 0 \\ 0 & 0 & 1 \end{pmatrix} = \begin{pmatrix} 1 & 1 & 0 & 1 \\ 1 & 0 & 1 & 1 \\ 0 & 1 & 1 & 1 \\ 0 & 1 & 1 & 1 \\ 1 & 1 & 1 & 0 \\ 1 & 0 & 1 & 1 \end{pmatrix}$$

At block 320, the dot product of the joint decoding matrix $[H_j]$ and the code word matrix [C] is checked to determine if it is invertible. That is, there is some matrix such that a resultant matrix [R] of $[H_j]\cdot[C]$ has an inverse matrix $[R]^{-1}$, wherein [R] $[R]^{-1}$ is equal to an identity matrix [I]. If the resultant matrix [R] is invertible, the errors in the write can be determined. A quick check can be used to determine if $[R]^{-1}$ exists without solving for it. For example, for an invertible matrix $[R]^{-1}$ to exist, the number of rows must equal the number of columns. Additionally, for an invertible matrix $[R]^{-1}$ to exist, the product does nothing to a vector V such that [R] $[R]^{-1}$ V=V, which necessarily means [R] V≠0. The invertible matrix exists if and only if elimination produces n pivots. There are other tests to checks if [R] is invertible as well and may be used to determine whether the resultant matrix [R] is invertible without actually calculating the inverse resultant matrix $[R]^{-1}$. Thus, the check may utilize any suitable method for making a determination if the resultant matrix [R] is invertible.

If the resultant matrix [R] was invertible, joint decoding solves for the erased error bits in block 364. The solution provides that you multiply each column of the joint decoding matrix $[H_j]$ with each row of the code word [C] matrix representing the data values in addition to the erased bits, i.e., containing unknown values. Solving the joint matrix equation looks like the following:

$$\begin{pmatrix} H_1 \\ H_2 \end{pmatrix} c = 0$$

which equals [R] and yields:

$$\begin{pmatrix} 1 & 1 & 0 & 1 \\ 1 & 0 & 1 & 1 \\ 0 & 1 & 1 & 1 \\ 0 & 1 & 1 & 1 \\ 1 & 1 & 1 & 0 \\ 1 & 0 & 1 & 1 \end{pmatrix} \begin{pmatrix} c_1 \\ c_2 \\ c_3 \\ c_4 \end{pmatrix} = 0$$

The result of the matrix multiplication equals zero when there are no write errors. Thus, we can set the resultant to zero and create linear independent formulas to solve for the unknown values in the code matrix [C]. At block 374, the matrix is checked to determine if it is fully ranked. The rank of the matrix is indicative of the maximum number of linear independence equations. As the rank increases, there is a higher probability where you can find a solution where the resultant matrix [R], i.e., $[H]\cdot[C]$, is invertible and you can solve for the unknown values, $C_n$ in the [C] matrix. In the example of four unknowns, four linear independent equations allow the code word matrix to be solved and thus the value of each of the four erased bits positions. Thus, the matrix must be fully ranked to solve for $C_1$-$C_4$.

If the matrix is fully ranked, at block 364 the code word matrix [C] is solved for the unknown bits in the four locations of the comparison from the two writes. When you have 'n' unknowns, you need at least 'n' equations to solve for all of them. For example, four linear equations may allow you to solve for the four unknowns. You will be able to find the solution using a method for solving simultaneous equation, such as substitution and elimination. The idea is to combine the equations in order to reduce the number of variables and then you can plug the variable into the other equations to solve for the remaining unknowns. After solving for the unknown bits in the comparison of the first write and the second write, the value can be set for the unknown bits and the comparison is accepted as the write. At block 356, a second block of data is written to new sectors in the NVM.

If you cannot do an inversion or do not have a full ranked matrix, at block 374, the word in the DRAM is rewritten to a third data sector. The third data sector is written to a third location different than both the second data sector and the first data sector. Thus allowing the first data sector, the second data sector and the third data sector to coexist on the NVM for future reading.

At block 328, the third data sector is read to check the accuracy of the write. Again, the write verify process writes the data in the second data sector of the NVM from the DRAM and reads then it back. At block 330, the read back bits from the NVM are compared to the original bits stored in the DRAM to check for write errors. A determination is made to check if the number of errors exceeds the threshold value. If the number of errors is one, and thus does not exceed the threshold value, at block 364, the error is solved using an error correction code to determine the bad sector and the value of the sector. The value of the bit is fixed and the write to the third data sector is accepted. If on read back it is determined that there are no errors in the write to the third data sector, at block 354, the write in the third data sector is accepted. At block 356, a second block of data is written to new sectors in the NVM to continue writing to the NVM.

However, for more than one error, at block 334 joint decoding may be applied using the information from the third, second and first write. The third write generates an [$H_3$] parity check matrix for help in generating more independent equations for soling the unknowns in the code word matrix [C]. The likelihood of obtaining a solution after the $3^{rd}$ write is extremely high. The third matrix is placed above, or below, the second and first matrix [$H_j$] to create [$H_{j2}$]. For example:

$$\begin{pmatrix} H_1 \\ H_2 \\ H_3 \end{pmatrix} = [H_{j2}] \text{ and } [H_{j2}] \cdot [C] = 0$$

At block 336 we attempt to determine if a second resultant matrix [$R_2$], i.e., ([Hj2]·[C]), is invertible and if matrix [C] has a solution. If the matrix is invertible, we can solve for the four unknowns $C_1$-$C_4$ in the code matrix [C] in block 364. Upon solving the code matrix [C] four unknowns, the unknown bits in the comparison of the first write and the second write can be set with the determined values and the comparison is accepted as the write. At block 356, a second block of data is written to new sectors in the NVM. If the second resultant matrix [$R_2$] is not invertible and still fails to provide a solution after the $3^{rd}$ write, then there is a high likelihood of some error in the data and in block 340 the error is accepted. We then move on to the next block to write at block 356 for continued writing to the NVM.

Advantageously, we can have a fast and weak error correction code wherein if the number of errors is beyond correctability, the entire block is rewritten. In some embodiments, the total number of correctable errors is no greater than one error or else the block of data may be re-written. The rewritten data (second write) is placed in a new or different physical location. The rewrite is not an overwrite. If the second write is without errors, this data is used and the control circuit may continue with the data writing. With a very low RBER, the likelihood of an error occurring in the same location is remote. Thus, a comparison of the two writes provides a determination for the locations of the correct bits. Where there is an error in the first write, the second write determines the location of the error in the first write. Thus, we can increase the data rate while decreasing the read latency and the probability of data loss in the NVMs.

Figure 4A:
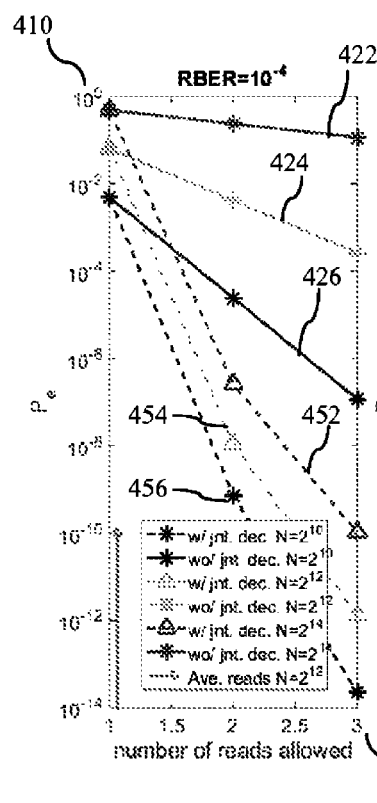
FIGS. 4A-4C are graphs illustrating error rate probabilities.
Figure 4B:
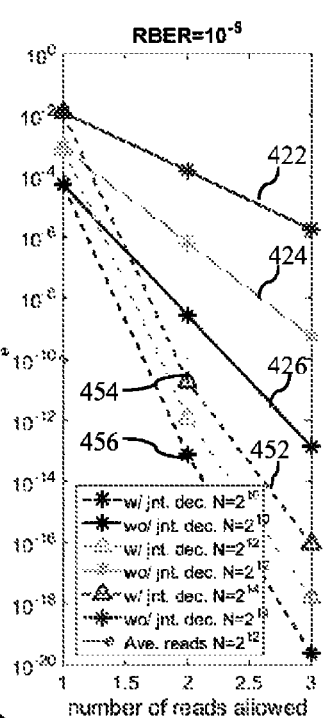
Figure 4C:
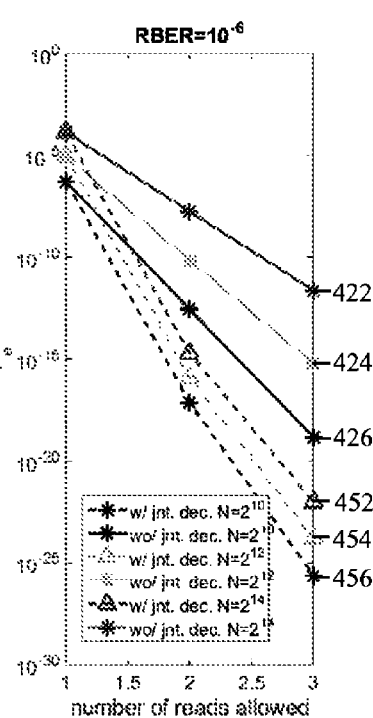

FIGS. 4A-4C are graphs illustrating the probability of data loss. A y-axis 410 displays the probability of bit error rate and an x-axis 450 displays the number of reads on each of the FIGS. 4A-4C. The data rate, read latency, and probability of data loss have been improved drastically compared to the conventional scheme, i.e., using error-correction codes (ECCs) based on mathematical analysis and the Matlab verification shown in FIG. 4A through FIG. 4C. FIG. 4A is a graph for a data storage system 100 having a raw bit error rate on the order of $10^{-4}$. FIG. 4B is a graph for a data storage system 100 having a raw bit error rate on the order of $10^{-5}$. FIG. 4C is a graph for a data storage system 100 having a raw bit error rate on the order of $10^{-6}$. As discussed supra, the RBER for PCM based NVM is on the order of $10^{-5}$ or $10^{-6}$ which are illustrated in FIGS. 4B and 4C respectively.

FIGS. 4A through 4C illustrate the raw block rate error for writes of three different block lengths each using a traditional Hamming code and alternately using joint decoding for error correction. The solid line labeled 422 graphs the probability of block error rate for a block having a length of $10^{14}$ bits (16,384 bits) using Hamming code error correction. The solid line labeled 424 graphs the probability of block error rate for a block having a length of $10^{12}$ bits (4096 bits) using Hamming code error correction. The solid line labeled 426 graphs the probability of block error rate for a block having a length of $10^{10}$ bits (1024 bits) using Hamming code error correction. The dashed line labeled 452 graphs the probability of block error rate for a block having a length of $10^{14}$ bits (16,384 bits) using joint decoding. The dashed line labeled 454 graphs the probability of block error rate for a block having a length of $10^{12}$ bits (4096 bits) using joint decoding. And finally, the dashed line labeled 456 graphs the probability of block error rate for a block having a length of $10^{10}$ bits (1024 bits) using joint decoding.

As shown in FIGS. 4A through 4C, the longer the code word, i.e., items 422 and 452, the higher the probability of raw block errors (Pe). However, the probability of the block error rate decreases significantly under the methodology of the joint decode method and has a high probability of being determinant after the $2^{nd}$ read.

Advantageously, the methodology leverages the fast read speeds and the simple error checking schema, to make the decoding as simple as possible. Thus, minimizing the entire write process for data to the NVM. Thus the error checking can take advantage of the very fast read speeds without having to compromise the write time with complicated error checking schemas.

While the foregoing is directed to embodiments of the disclosure, other and further embodiments may be devised without departing from the basic scope thereof, and the scope thereof is determined by the claims that follow.

What is claimed is:

1. An error correction method of a data storage system having non-volatile memory, comprising:
    writing data to a first location in the non-volatile memory from a block of user data stored in DRAM;
    verifying the data written to the first location and identifying errors;
    re-writing the block of user data to a second location in the non-volatile memory upon determining the number of identified errors exceed a threshold value;
    verifying the data written to the second location and identifying errors;
    comparing the data written to the first location and the data written to the second location and identifying all discrepancy bits in the comparison;
    applying joint decoding;
    building a joint parity check matrix for the data written to the first location and the data written to the second location;
    building a code word matrix with the comparison, wherein the code matrix includes variables for the identified discrepancy bits;
    determining if a resultant of the joint parity check matrix and the code word matrix is invertible; and
    solving simultaneous equation to determine values for the identified discrepancy bits.

2. The error correction method for non-volatile memory of claim 1, wherein the second location does not overwrite the first location.

3. The error correction method for non-volatile memory of claim 1, wherein the threshold value is one.

4. The error correction method for non-volatile memory of claim 1, further comprising:
    determining the number of identified errors from the write to the second location exceeds a second threshold value;
    re-writing the block of user data to a third location;
    verifying the data written to the third location and identifying errors;
    building a second joint parity check matrix for the data written to the first location, the data written to the second location, and the data written to the third location; and
    determining if the second joint parity check matrix is invertible.

5. The error correction method for non-volatile memory of claim 4, wherein the second threshold value is one.

6. A non-transitory computer-readable storage medium storing a program, which, when executed by a processor of a data storage system performs an operation for correcting errors in non-volatile memory, the operation comprising:
    writing data to a first location in the non-volatile memory from a block of user data stored in DRAM;
    verifying the data written to the first location and identifying errors;
    re-writing the block of user data to a second location in the non-volatile memory upon determining the number of identified errors exceed a threshold value;
    verifying the data written to the second location and identifying errors;
    comparing the data written to the first location and the data written to the second location and identifying all discrepancy bits in the comparison;
    applying joint decoding;
    building a joint parity check matrix for the data written to the first location and the data written to the second location;
    building a code word matrix with the comparison, wherein the code matrix includes variables for the identified discrepancy bits;
    determining if a resultant of the joint parity check matrix and the code word matrix is invertible; and
    solving simultaneous equation to determine values for the identified discrepancy bits.

7. The computer-readable storage medium of claim 6, wherein the second location does not overwrite the first location.

8. The computer-readable storage medium of claim 6, wherein the threshold value is one.

9. The computer-readable storage medium of claim 6, further comprising:
    determining the number of identified errors from the write to the second location exceeds a second threshold value;
    re-writing the block of user data to a third location;
    verifying the data written to the third location and identifying errors;
    building a second joint parity check matrix for the data written to the first location, the data written to the second location, and the data written to the third location; and
    determining if the second joint parity check matrix is invertible.

10. The computer-readable storage medium of claim 9, wherein the second threshold value is one.

11. A data storage system, comprising:
    a processor; and
    a non-volatile memory, wherein the memory includes an application program configured to perform an operation for correcting errors in the non-volatile memory, the operation comprising:
    writing data to a first location from a block of user data stored in DRAM;
    verifying the data written to the first location and identifying errors;
    re-writing the block of user data to a second location upon determining the number of identified errors exceed a threshold value;
    verifying the data written to the second location and identifying errors;
    comparing the data written to the first location and the data written to the second location and identifying all discrepancy bits in the comparison;
    applying joint decoding;
    building a joint parity check matrix for the data written to the first location and the data written to the second location;
    building a code word matrix with the comparison, wherein the code matrix includes variables for the identified discrepancy bits;
    determining if a resultant of the joint parity check matrix and the code word matrix is invertible; and
    solving simultaneous equation to determine values for the identified discrepancy bits.

12. The system of claim 11, wherein the second location does not overwrite the first location.

13. The system of claim 11, further comprising:
re-writing the block of user data to a third location;
verifying the data written to the third location and identifying errors;
building a second joint parity check matrix for the data written to the first location, the data written to the second location, and the data written to the third location; and
determining if the second joint parity check matrix is invertible.

14. The system of claim 11, wherein the threshold value is one.

* * * * *